(12) United States Patent
Wu et al.

(10) Patent No.: US 9,059,729 B1
(45) Date of Patent: Jun. 16, 2015

(54) STATISTICAL COMPRESSIBILITY DETERMINATION SYSTEM AND METHOD

(71) Applicant: Tidal Systems, Sunnyvale, CA (US)

(72) Inventors: Yingquan Wu, Palo Alto, CA (US); Alexander Hubris, San Jose, CA (US)

(73) Assignee: TIDAL SYSTEMS, Santa Clara, CA (US)

( * ) Notice: Subject to any disclaimer, the term of this patent is extended or adjusted under 35 U.S.C. 154(b) by 0 days.

(21) Appl. No.: 14/293,850

(22) Filed: Jun. 2, 2014

(51) Int. Cl.
*H03M 7/34* (2006.01)
*H03M 7/30* (2006.01)
*H03M 7/40* (2006.01)

(52) U.S. Cl.
CPC .............. *H03M 7/3086* (2013.01); *H03M 7/40* (2013.01)

(58) Field of Classification Search
CPC ............ H03M 7/3084; H03M 7/3086; H03M 7/3088; H03M 7/40
USPC .................................................. 341/50–51, 87
See application file for complete search history.

(56) References Cited

U.S. PATENT DOCUMENTS

| 7,538,695 | B2 * | 5/2009 | Laker et al. | 341/51 |
| 7,538,696 | B2 * | 5/2009 | Laker et al. | 341/51 |
| 8,125,357 | B1 * | 2/2012 | Hamlet et al. | 341/51 |
| 8,593,308 | B1 * | 11/2013 | Biran et al. | 341/65 |

* cited by examiner

*Primary Examiner* — Khai M Nguyen
(74) *Attorney, Agent, or Firm* — David R. Stevens; Stevens Law Group

(57) ABSTRACT

A compression algorithm is disclosed in which compressibility of an input frame is determined. If a frame is found to be compressible, it is input to a compression algorithm, otherwise the frame may bypass the compression algorithm. Literals of length N bits in a frame are sorted into $2^N$ bins such a counter $B_i$ indicates a number of literals of value i. The maximum and minimum counter values are evaluated to estimate the compressibility of the file. For example, if $B_{max}$ is the maximum counter value and $B_{min}$ is the minimum counter value, then If $B_{max} < A*B_{min}$ (A being a value greater than 1, e.g. 4), the frame may be deemed to be uncompressible, otherwise the frame may be deemed to be compressible and compressed according to the DEFLATE algorithm or some other compression algorithm.

20 Claims, 3 Drawing Sheets

STATISTICAL COMPRESSIBILITY DETERMINATION SYSTEM AND METHOD

BACKGROUND

1. Field of the Invention

This invention relates to systems and methods for compression of data.

2. Background of the Invention

Modern lossless data compression is a class of data compression algorithms that allow the original data to be perfectly reconstructed from the compressed data. By contrast, lossy data compression permits reconstruction only of an approximation of the original data, while this usually allows for improved compression rates.

DEFLATE is a lossless data compression algorithm that uses a combination of the LZ77 algorithm and Huffman coding. It was originally defined by Phil Katz for version 2 of his PKZIP archiving tool and was later specified in standard RFC 1951. DEFLATE has widespread uses, for example in GZIP compressed files, PNG (Portable Network Graphic) image files and the ZIP file format for which Katz originally designed it.

DEFLATE compression is very well understood and the source code for programs like GZIP are readily accessible in the public domain. The algorithm to implement compression is relatively complex to do in hardware for high bandwidth application given that the GZIP compression is based on the LZ77 algorithm and Huffman coding.

The objective of compression is to use copy commands later in a data stream that appears earlier in the data stream. As such all compression implementations require a search history buffer and some type of compare length function to determine the longest length that can be used for the copy command. One efficient implementation for search matching in the previous history is to match upon a hash chain, which is built on hash map of three-byte string.

Among the abundant lossless compression algorithms, DEFLATE compression achieves a great trade-off between hardware complexity and compression rate. For example, in GZIP, the data is hashed and compared to generate a copy or literal command per the Lempel-Ziv algorithm or comparable algorithm. Once the statistics for the data to be compressed are gathered, they are Huffman encoded and then compressed to be sent out.

However, some host data is uncompressible by nature. For instance, video and audio data are often already compressed using lossy compression algorithms; encrypted data is not compressible; compressed data is not or hardly compressible.

The methods disclosed herein provide an improved approach for compressing data, such as using the DEFLATE algorithm, by detecting uncompressible data based on attributes of the data itself.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
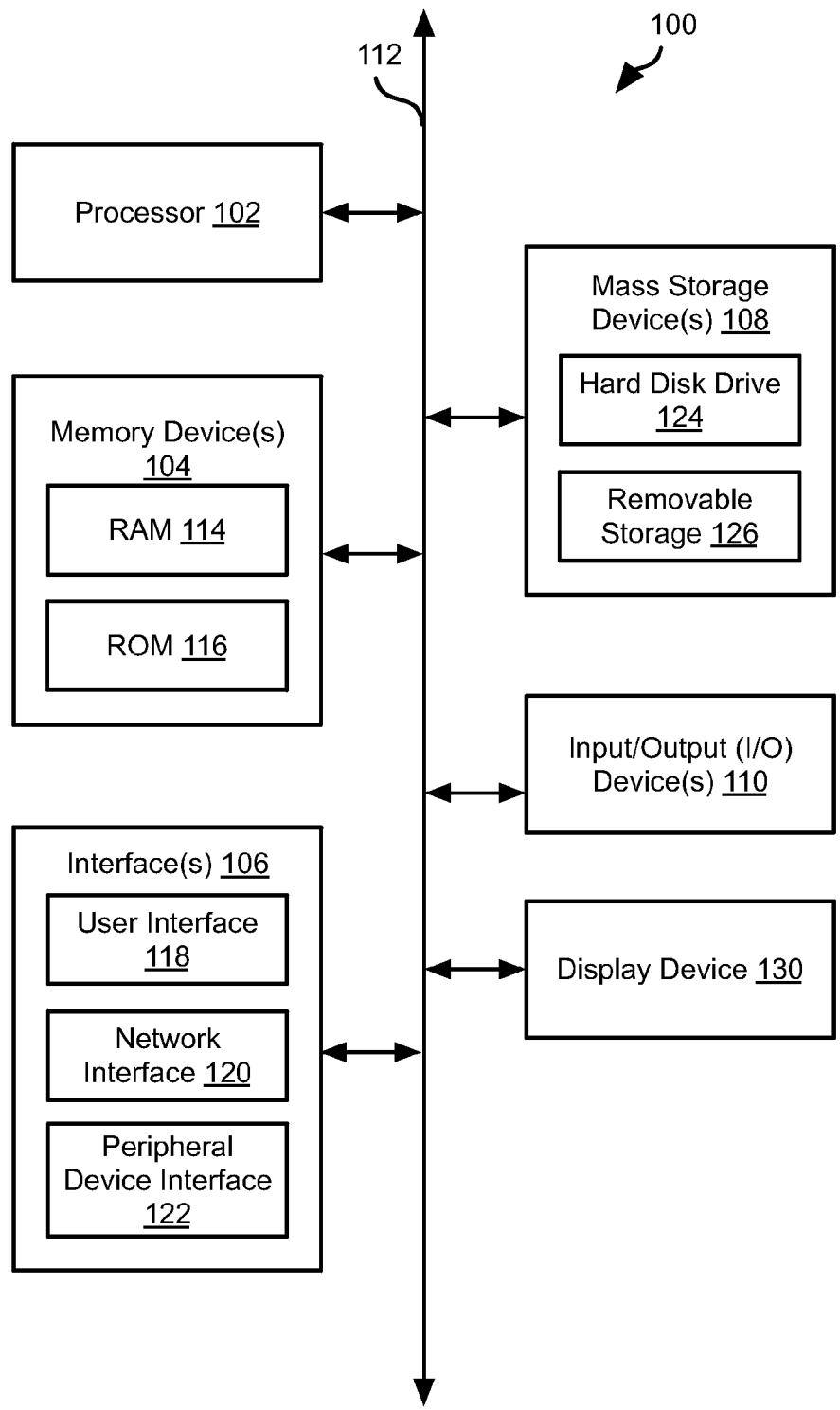
FIG. 1 is a schematic block diagram of a computer system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods.

In particular, in order to maximize the bandwidth throughput of the compression engine, a mechanism is needed to determine the compressibility of the incoming data so that the engine does not waste bandwidth and power on trying to compress data that is not or hardly compressible. The above observation calls for a fast detection mechanism to rule out uncompressible data, however, must pass highly compressible data.

The systems and methods disclosed herein provide an improved approach wherein literals of length N bits in a frame are sorted into $2^N$ bins, e.g. for a given literal of value M, a counter associated with value M will be incremented, with M being a value from 0 to $2^N$. The maximum and minimum counter values are evaluated to estimate the compressibility of the file. For example, $B_{max}$ is the maximum counter value and $B_{min}$ is the minimum counter value. If $B_{max} < A*B_{min}$, then the frame may be deemed to be uncompressible, otherwise the frame may be deemed to be compressible and compressed according to the DEFLATE algorithm or some other compression algorithm.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

The methods described herein provide improved performance and power usage by eliminating some attempts to compress data that is not compressible or is not likely to be compressible by means of a compression algorithm. For an input page of literals of length N, uncompressible data must exhibit near equal probability among all 2^N possible literal values (e.g. 256 possible literals for literals of one byte in length). Though the reverse may not hold true generally, it is the case for most prevalent applications (e.g., .dll, .txt, .exe, .o, .html, etc.). On the other hand, data with highly unequally distributed literals can certainly be compressed, e.g., using Huffman coding.

With data frames being considered for compression in SSD (solid state drive) systems, the normal path is to allow the compression engine to determine if the data is compressible or not while processing the data. Once the data frame is processed by the compression engine, the engine will make a determination as to whether the data frame is compressible or not. By sending the data that is not compressible to the compression engine, bandwidth is wasted by the compression engine. In the systems and methods disclosed herein, the data frame can be pre-processed to determine if it is compressible or not by merely gathering statistics and analyzing the statistics of the data frame to be compressed. A separate engine is used to gather and process the statistics before sending the data to the compression engine so that the compression engine does not waste bandwidth processing the data.

Figure 2:
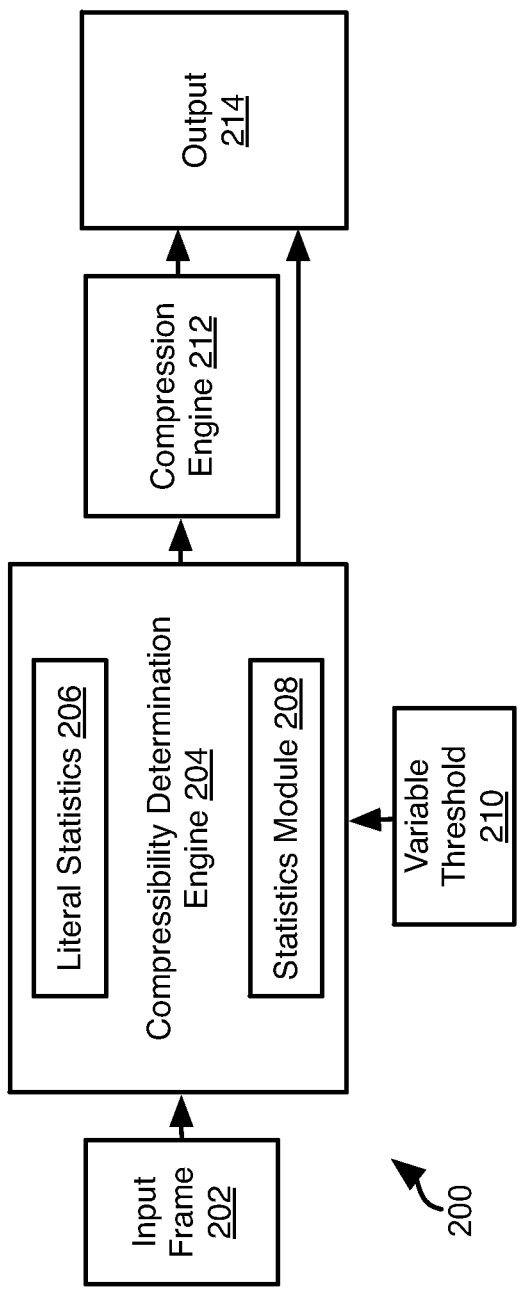
FIG. 2 is schematic block diagram of components suitable for implementing methods in accordance with embodiment of the present invention.

The pre-processing engine is shown in FIG. 2. The components of FIG. 2 may be individual electronic components implemented in a computing device 100 or software modules executable by a computing device. An input frame 202 of any arbitrary number of literals of length N bits is input into a compressibility determination engine 204. The engine 204 gathers literal statistics 206 for the frame and a statistics module 208 evaluates the statistics 206 with respect to one or more thresholds 210. The threshold 210 may be variable to enable control of what input frames will be deemed uncompressible. For purpose of this disclosure, a frame is deemed "uncompressible" if the methods disclosed herein indicate that it is unlikely to be compressible. However, such a frame may still be somewhat compressible or even significantly compressible, though the methods disclosed herein have been found to be highly accurate in detecting frames with low compressibility.

The compressibility determination engine 204 may make a decision regarding the input frame 202 and output the frame to a compression engine 212 that will compress the input frame 202 and transmit a compressed frame to an output 214. Otherwise the compressibility determination engine 204 may bypass the compression engine 212 and transmit the input frame to the output 214 without compression. The compression algorithm executed by the compression engine 212 may be any compression algorithm known in the art, such as the DEFLATE algorithm discussed above.

Figure 3:
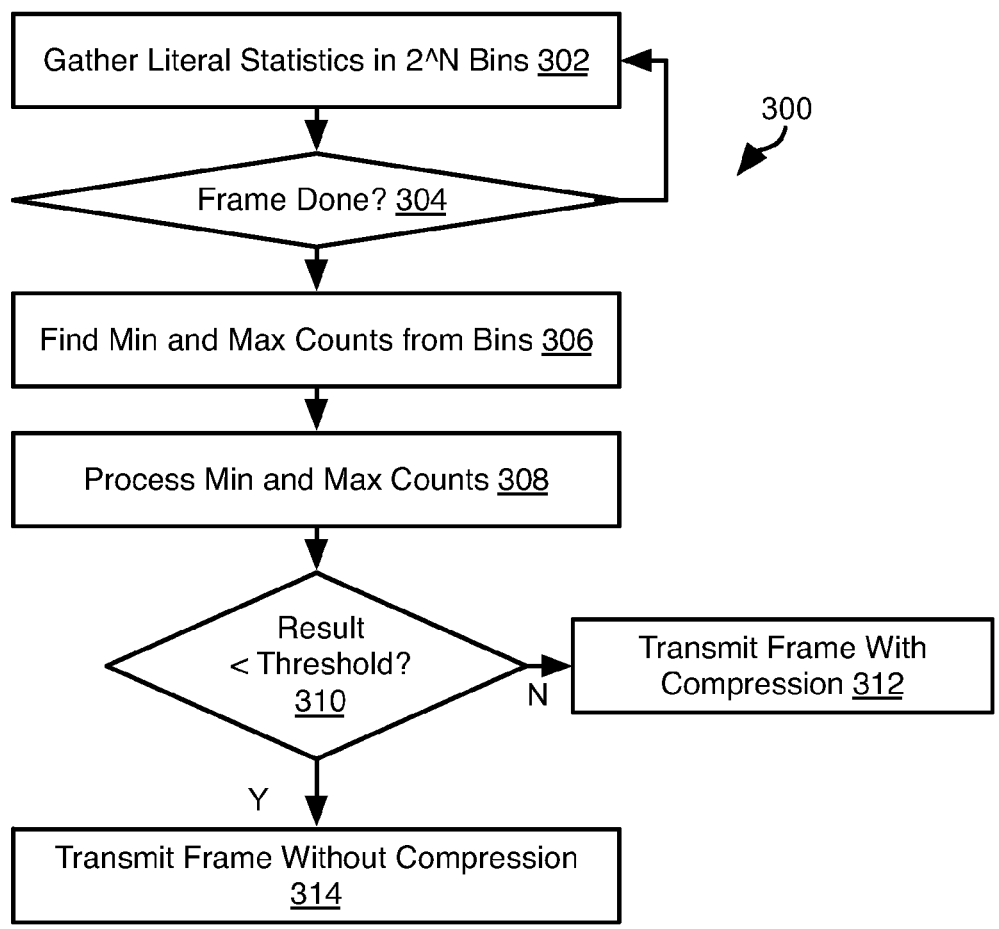
FIG. 3 is a process flow diagram of a method for detecting compressibility of data in accordance with an embodiment of the present invention.

Referring to FIG. 3, the illustrated method 300 may be executed with respect to an input page including a plurality of literals of length N bits and having possible values from 0 to 2^N−1. For example, in one implementation, the smallest unit of data entering the compression engine is a byte, which is 8 bits of data. Therefore, there are 256 possible combinations of data for the byte being compressed. To make a determination of compressibility, the data will be gathered 302 into 2^N bins (e.g. 256 bins: $B_0, B_1, \ldots B_{255}$) until all of the literals in the data frame to be compressed are processed. Specifically, let $d_0, d_1, d_2, \ldots d_{n-1}$ be the sequence of host data sector, then $B_i$ is given by (1). That is, each bin $B_i$ indicates a number of literals $d_j$ having the value i.

$$B_i \triangleq |\{j: d_j = i\}|, i=0,1,2 \ldots 2^N-1 \tag{1}$$

The method 300 may include processing the input page as a stream of data in which the literals are transmitted one at time or in packets including one or more literals. Accordingly step 302 may be repeated until an input frame is found 304 to be done, i.e. a complete frame has been received.

Once the data is binned, the $B_{min}$ and $B_{max}$ of the bins are found 306, such as according to (2). $B_{min}$ is therefore equal to the number of occurrences of the least common literal in the input page and $B_{max}$ is equal to the number of occurrences of the most common literal in the input page.

$$B_{min} = \min_{0 \leq i < 2^N} \{B_i\}; B_{max} = \max_{0 \leq i < 2^N} \{B_i\} \tag{2}$$

Then the $B_{max}$ and $B_{min}$ may be further processed 308. For example, Min and $B_{max}$ may be against a programmable ratio threshold a to determine if the data frame is compressible or not. For example, $B_{min}$ and $B_{max}$ may be compared according to (3)

$$B_{max} < A \cdot B_{min} \tag{3}$$

If the $B_{min}$ and $B_{max}$ values are found 310 to meet a threshold condition, then the input frame may be found to be compressible and then be transmitted 312 to a compression engine 212 for compression. If the $B_{min}$ and $B_{max}$ values are not found 310 to meet the threshold condition, the input frame may be transmitted 314 to an output or otherwise bypass a compression step before proceeding to a subsequent step downstream from a compression step, such as storage or transmission over a transmission line or wirelessly. For example, given a threshold A>1, the data may be deemed to be uncompressible if (3) is satisfied. The data may be deemed to be compressible if (3) is not satisfied, i.e. $B_{max}$ is greater than A times $B_{min}$.

The above approach advantageously detects uncompressible data. In particular, when the data is purely random, $B_{min}$ must be close to $B_{max}$. In our extensive studies of data compression over 4 KB sector size and literals of one byte in length, we found A=4 achieves a good trade-off between filtering uncompressible data while passing compressible data.

In another embodiment, for literals of length N statistics are gathered for sub-literals of length N/2. For example, 4-bit nibbles instead of 8 bit bytes so that only 16*2=32 bins are needed instead of 256 bins. Specifically, two sets of bin counters are defined) $B_i^{(0)}$ and $B_i^{(1)}$, i=1 to $2^{(N/2)}-1$.

The values of the counters $B_i^{(0)}$ and $B_i^{(1)}$ may be determined according to (4) and (5). Equations (4) and (5) are particularly useful where a system is unable to process a unit of data less than N bits long and therefore cannot read words of length N/2 and process them individually. Equations (4) and (5) may be executed with respect to each literal. Equation (4) updates a counter $B_i^{(0)}$ according to a value of the lower half of the literal and (5) updates a counter $B_i^{(1)}$ according to the value of the upper half of the literal.

$$B_i^{(0)} \triangleq |\{j: i = d_j \& 2^{N/2}-1\}|; i=0,1,2,\ldots 2^{N/2}-1 \tag{4}$$

$$B_i^{(1)} \triangleq |\{j: i = d_j >> N/2\}|; i=0,1,2,\ldots 2^{N/2}-1 \tag{5}$$

The page may be deemed incompressible based on (6), where $B_{max}^{(0)}$ is the number of occurrences of the most common N/2 bit value $B_i^{(0)}$, $B_{min}^{(0)}$ is the number of occurrences of the least common N/2 bit value $B_i^{(0)}$, $B_{max}^{(1)}$ is the number of occurrences of the most common N/2 bit value $B_i^{(1)}$, $B_{min}^{(1)}$ the number of occurrences of the least common N/2 bit value $B_i^{(1)}$.

$$B_{max}^{(0)} < A \cdot B_{min}^{(0)} \text{ or } B_{max}^{(1)} < A \cdot B_{min}^{(1)} \tag{6}$$

Using (4), (5), and (6) significantly reduces the number of bin counters, but is slightly less accurate for prediction of compressibility. A may be greater than one. For example, A=4 has been found to provide effective compressibility detection.

In another embodiment, for literals of length N statistics are gathered for sub-literals of length N/2+1, which may be overlapping. For example, 5-bit nibbles instead of 8 bit bytes so that only 32*2=64 bins are needed instead of 256 bins. Specifically, two sets of bin counters are defined) $b_i^{(0)}$ and $B_i^{(1)}$, i=1 to $2^{(N/2+1)}-1$.

The values of the counters) $B_i^{(0)}$ and $B_i^{(1)}$ may be determined according to (7) and (8). Equations (7) and (8) may be executed with respect to each literal. Equation (7) updates a counter $B_i^{(0)}$ according to a value of the lower half of the literal and (8) updates a counter $B_i^{(1)}$ according to the value of the upper half of the literal.

$$B_i^{(0)} \triangleq |\{j:i=d_j \& 2^{N/2+1}-1\}|; i=0,1,2,\ldots 2^{N/2+1}-1 \quad (7)$$

$$B_i^{(1)} \triangleq |\{j:i=d_j >> N/2-1\}|; i=0,1,2,\ldots 2^{N/2+1}-1 \quad (8)$$

The page may be deemed incompressible based on (6), where $B_{max}^{(0)}$ is the number of occurrences of the most common N/2 bit value $B_i^{(0)}$, $B_{max}^{(1)}$ is the number of occurrences of the least common N/2 bit value $B_i^{(0)}$, $B_{max}^{(1)}$ is the number of occurrences of the most common N/2 bit value $B_i^{(1)}$, $B_{min}^{(1)}$ the number of occurrences of the least common N/2 bit value $B_i^{(1)}$. Assigning strings of length N/2+1 to bins is more accurate than for strings of length N/2, but less accurate than for strings of length N.

Various modifications to the above approaches may be made. For example, for the plurality of bins $B_i$, one or more other statistical values may be calculated in addition to or as an alternative to the maximum and minimum values. For example, one or more of a standard deviation, mean (average) of the bins $B_i$ may be calculated. These values may then be compared to a threshold to determine compressibility. For example, a standard deviation greater than some threshold value may indicate the data is too random to compress whereas a standard deviation lower than that value may indicate compressibility.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What are claimed are listed below:

1. A method for compression comprising performing, by a computer system:
    receiving a first input frame including a plurality of first literals each of length N bits;
    determining a plurality of first counts $B_i$, i=0 to $2^N$, each first count $B_i$ indicating a number of literals of the plurality of first literals of value i;
    generating one or more statistical values characterizing the plurality of first counts $B_i$;
    processing the one or more statistical values to obtain a first result;
    determining that the first result does not meet a threshold condition; and
    refraining from compressing the first input frame in response to determining that the first result does not meet the threshold condition.

2. The method of claim 1, wherein generating the one or more statistical values characterizing the plurality of first counts comprises determining a first maximum count of the plurality of first counts $B_i$ and determining a first minimum count of the plurality of first counts $B_i$.

3. The method of claim 2, further comprising:
    receiving a second input frame including a plurality of second literals each of length N bits;
    determining a plurality of second counts $B_i$, i=0 to $2^N$, each second count $B_i$ indicating a number of literals of the plurality of second literals of value i;
    determining a second maximum count of the plurality of second counts $B_i$;
    determining a second minimum count of the plurality of second counts $B_i$;
    processing the second maximum count and second minimum count to obtain a second result;
    determining that the second result meets the threshold condition; and
    compressing the second input frame in response to determining that the second result meets the threshold condition.

4. The method of claim 3, wherein compressing the second input frame compresses performing the DEFLATE algorithm.

5. The method of claim 2, wherein processing the first maximum count and first minimum count to obtain the first result comprises determining whether the first maximum count is less than A times the minimum count, A being a number greater than one.

6. The method of claim 5, wherein determining that the first result does not meet the threshold condition comprises determining that the first maximum count is less than A times the minimum count.

7. The method of claim 5, wherein A is equal to 4.

8. The method of claim 1, wherein generating the one or more statistical values characterizing the plurality of first counts $B_i$ comprises calculating at least one of a standard deviation of the plurality of first counts $B_i$ and an average count of the plurality of first counts $B_i$.

9. A method for compression comprising performing, by a computer system:
    receiving a first input frame including a plurality of first literals each of length N bits;
    determining a plurality of first counts $B_i$, i=0 to $2^N-1$, each first count $B_i$ indicating a number of literals of the plurality of first literals of value i;
    determining a first maximum count of a first portion of the first counts $B_i$, for i=0 to $2^{(N/2)}-1$;
    determining a first minimum count of the first portion of the first counts $B_i$;
    determining a second maximum count of a second portion of the first counts $B_i$ for i=$2^{(N/2)}$ to $2^N-1$;
    determining a second minimum count of the second portion of the first counts $B_i$;
    processing the first maximum count, first minimum count, second maximum count, and second minimum count to obtain a first result;
    determining that the first result does not meet a threshold condition; and
    refraining from compressing the first input frame in response to determining that the first result does not meet the threshold condition.

10. The method of claim 9, further comprising:
    receiving a second input frame including a plurality of second literals each of length N bits;
    determining a plurality of second counts $B_i$, i=0 to $2^N-1$, each second count $B_i$ indicating a number of literals of the plurality of second literals of value i;

determining a third maximum count of a first portion of the second counts $B_i$, for i=0 to $2^{(N/2)}-1$;

determining a third minimum count of the first portion of the second counts $B_i$;

determining a fourth maximum count of a second portion of the second counts $B_i$ for i=$2^{(N/2)}$ to $2^N-1$;

determining a fourth minimum count of the second portion of the second counts $B_i$;

processing the third maximum count, third minimum count, fourth maximum count, and fourth minimum count to obtain a second result;

determining that the second result meets the threshold condition; and compressing the second input frame in response to determining that the second meets the threshold condition.

11. The method of claim 10, wherein compressing the second input frame compresses performing the DEFLATE algorithm.

12. The method of claim 9, wherein processing the first maximum count and first minimum count to obtain the first result comprises determining whether the first maximum count is less than A times the minimum count, A being a number greater than one.

13. The method of claim 12, wherein determining that the first result does not meet the threshold condition comprises determining that the first maximum count is less than A times the minimum count.

14. The method of claim 12, wherein A is equal to 4.

15. A computing device comprising electronic components programmed to:

receive an input frame including a plurality of literals each of length N bits;

determine a plurality of counts $B_i$, i=0 to $2^N$, each count $B_i$ indicating a number of literals of the plurality of literals of value i;

generate one or more statistical values characterizing the plurality of counts $B_i$;

process the one or more statistical values to obtain a result;

if the result does not meet a threshold condition, outputting the input frame without compressing the input frame if the result meets the threshold condition, compressing the input frame to obtain a compressed frame and outputting the compressed frame.

16. The computing device of claim 15, wherein the electronic components are further programmed to generate the one or more statistical values characterizing the plurality of counts by determining a maximum count of the plurality of counts $B_i$ and determining a minimum count of the plurality of counts $B_i$.

17. The computing device of claim 16, wherein the threshold condition is the maximum count being greater than or equal to A times the minimum count, A being a number greater than one.

18. The computing device of claim 17, wherein A is equal to 4.

19. The computing device of claim 15, wherein the electronic components are further programmed to generate the one or more statistical values characterizing the plurality of first counts $B_i$ by calculating at least one of a standard deviation of the plurality of first counts $B_i$ and an average count of the plurality of first counts $B_i$.

20. The computing device of claim 15, wherein the electronic components are further programmed to compress the input frame by performing the DEFLATE algorithm.

* * * * *